United States Patent
Liu et al.

(10) Patent No.: US 11,774,516 B2
(45) Date of Patent: Oct. 3, 2023

(54) DETECTING METHOD FOR AN OPERATING STATE OF A POWER SUPPLY AND A DETECTING APPARATUS

(71) Applicant: Delta Electronics (Shanghai) Co., Ltd., Shanghai (CN)

(72) Inventors: Yunfei Liu, Shanghai (CN); Haibin Song, Shanghai (CN); Daofei Xu, Shanghai (CN); Jinfa Zhang, Shanghai (CN)

(73) Assignee: Delta Electronics (Shanghai) Co., Ltd., Shanghai (CN)

( * ) Notice: Subject to any disclaimer, the term of this patent is extended or adjusted under 35 U.S.C. 154(b) by 4 days.

(21) Appl. No.: 17/660,212

(22) Filed: Apr. 22, 2022

(65) Prior Publication Data

US 2022/0349951 A1 Nov. 3, 2022

(30) Foreign Application Priority Data

Apr. 30, 2021 (CN) .......................... 202110483830.4

(51) Int. Cl.
*G01R 31/40* (2020.01)
*G01R 31/62* (2020.01)
(Continued)

(52) U.S. Cl.
CPC ......... *G01R 31/40* (2013.01); *G01R 19/0092* (2013.01); *G01R 19/32* (2013.01); *G01R 31/62* (2020.01)

(58) Field of Classification Search
CPC .... G01R 31/40; G01R 19/0092; G01R 19/32; G01R 31/62; G01R 19/16571;
(Continued)

(56) References Cited

U.S. PATENT DOCUMENTS 5,297,014 A * 3/1994 Saito .................... H02H 7/1213
  363/21.13
11,277,124 B2 * 3/2022 Lee .................... H03K 17/0812
(Continued)

FOREIGN PATENT DOCUMENTS

CN 106385084 A 2/2017
CN 106484004 B 9/2018
(Continued)

*Primary Examiner* — Tung X Nguyen
*Assistant Examiner* — Robert P Alejnikov, Jr.
(74) *Attorney, Agent, or Firm* — CKC & Partners Co., LLC

(57) ABSTRACT

The present application provides a detecting method of an operating state of a power supply and a detecting apparatus, where the power supply includes a primary circuit, a transformer and a secondary circuit. The secondary circuit includes a secondary current detecting unit, a temperature detecting unit and a secondary controlling unit. Firstly the secondary current detecting unit detects a current value of the secondary circuit, then the secondary controlling unit compares the current value of the secondary circuit with a preset current threshold. When the current value of the secondary circuit is less than or equal to the preset current threshold, the temperature detecting unit detects a temperature value of the power supply and the secondary controlling unit determines the operating state of the power supply according to the acquired temperature value of the power supply.

7 Claims, 4 Drawing Sheets

(51) Int. Cl.
*G01R 19/32* (2006.01)
*G01R 19/00* (2006.01)

(58) Field of Classification Search
CPC ........... H02M 3/33576; H02M 1/0009; H02M 1/327; G01K 3/00
USPC .................................................. 324/764.01
See application file for complete search history.

(56) References Cited

U.S. PATENT DOCUMENTS

| | | | | |
|---|---|---|---|---|
| 2002/0105767 | A1* | 8/2002 | Schuellein | H02H 7/1213 361/93.1 |
| 2006/0034102 | A1* | 2/2006 | Yang | H02M 3/33507 363/21.13 |
| 2015/0305129 | A1* | 10/2015 | Nishikawa | H05B 41/2887 315/224 |
| 2017/0356945 | A1* | 12/2017 | Lee | G01R 29/0871 |
| 2021/0270870 | A1* | 9/2021 | Chen | G01R 19/0092 |
| 2021/0302239 | A1* | 9/2021 | Nagano | H02M 1/327 |

FOREIGN PATENT DOCUMENTS

| | | | | |
|---|---|---|---|---|
| CN | 209169943 U | | 7/2019 | |
| CN | 111082668 A | * | 4/2020 | .............. H02M 1/32 |
| WO | WO-2014172838 A1 | * | 10/2014 | ........... G01R 31/027 |
| WO | WO-2021059583 A1 | * | 4/2021 | .......... H02M 1/0009 |

* cited by examiner

DETECTING METHOD FOR AN OPERATING STATE OF A POWER SUPPLY AND A DETECTING APPARATUS

CROSS-REFERENCE TO RELATED APPLICATIONS

This application claims priority to Chinese Patent Application No. 202110483830.4, filed on Apr. 30, 2021, which is hereby incorporated by reference in its entirety.

TECHNICAL FIELD

The present application relates to the technical field of power supply, and in particular, to a detecting method of an operating state of a power supply and a detecting apparatus.

BACKGROUND

With the rapid development of the science and technology, People's work and life have close relationship with the electronic equipment. Electronic equipment is inseparable from the power supply, and in order to make the superior performance of the electronic device, there are high security requirements to the power supply.

In the prior art, in order to ensure a power supply operates safely, it is necessary to detect the operating state of the power supply. For an isolated power supply, its operating state can be determined by detecting a primary circuit or a secondary circuit of the power supply. By determining the operating state with two independent methods, the power supply can meet various safety specifications, for example a limited power supply (LPS) test specification. Specifically, when the rated output power is far less than the LPS power level, although power detection accuracy of the primary circuit is low, the power supply can still meet the LPS test specifications by relying on the primary circuit when the current detecting unit of the secondary circuit is bypassed. However, when the rated output power is close to the LPS power level, the power supply may not meet the LPS test specifications by relying on the primary circuit due to its low detection accuracy, in case the current detecting unit of the secondary circuit is bypassed.

In an existing solution, a secondary control unit is used to detect the fluctuation of the output voltage to determine the output power of the power supply, thereby determining the operating state of the power supply. However, this solution has a strong dependence on the power detection accuracy of the primary control unit and requires high sampling accuracy of the secondary control unit, which will bring great challenge to the power supply cost.

SUMMARY

The present application provides a detecting method of an operating state of a power supply and a detecting apparatus, which are used for solving technical problems that the corresponding solution for detecting the operating state of the power supply in the prior art is poor in realizability and leads to the increase of the power supply cost.

In a first aspect, the present application provides a detecting method of an operating state of a power supply, where the power supply includes a secondary circuit, the detecting method including:

acquiring a current value of the secondary circuit, and comparing the current value of the secondary circuit with a preset current threshold;

acquiring a temperature value of the power supply and determining the operating state of the power supply according to the temperature value when the current value of the secondary circuit is less than or equal to the preset current threshold.

In a second aspect, the present application provides a detecting apparatus, which is applied to detect an operating state of a power supply, where the power supply includes a primary circuit, a transformer and a secondary circuit, the secondary circuit as the detecting apparatus including:

a secondary current detecting unit, electrically coupled to any one end of a secondary winding of the transformer, configured to detect a current value of the secondary circuit;

a temperature detecting unit, configured to detect a temperature value of the power supply; and a secondary controlling unit, electrically connected to the secondary current detecting unit and the temperature detecting unit, where the secondary controlling unit is configured to compare the current value of the secondary circuit with a preset current threshold, and determine the operating state of the power supply according to the acquired temperature value of the power supply when the current value of the secondary circuit is less than or equal to the preset current threshold.

The present application provides a detecting method of an operating state of a power supply and a detecting apparatus, where the power supply includes a primary circuit, a transformer and a secondary circuit. The secondary circuit includes a secondary current detecting unit, a temperature detecting unit and a secondary controlling unit. Firstly, the secondary current detecting unit detects a current value of the secondary circuit, and then the secondary controlling unit compares the current value of the secondary circuit with a preset current threshold. When the current value of the secondary circuit is less than or equal to the preset current threshold, the temperature detecting unit detects a temperature value of the power supply and the secondary controlling unit determines the operating state of the power supply according to the acquired temperature value of the power supply, thus independently realizing the detection of the operating state of the power supply by using the secondary circuit of the power supply. The detecting method provided by the present application can determine the operating state of the power supply according to the temperature value of the power supply detected by the temperature detecting unit when the secondary current detecting unit is in the abnormal state, so as to reduce dependence on the power detection accuracy of the primary circuit, which not only has a higher realizability and a wider applicability, but also has the advantage of not increasing the power supply cost.

BRIEF DESCRIPTION OF DRAWINGS

In order to explain the technical solution in the present application or in the prior art clearly, drawings used in the present application or in the prior art will be briefly introduced below. Obviously, the drawings in the following description are some embodiments of the present application. And for those of ordinary skill in the prior art, other drawings can be obtained according to these drawings without creative labor.

DETAILED DESCRIPTION OF EMBODIMENTS

Figure 1:
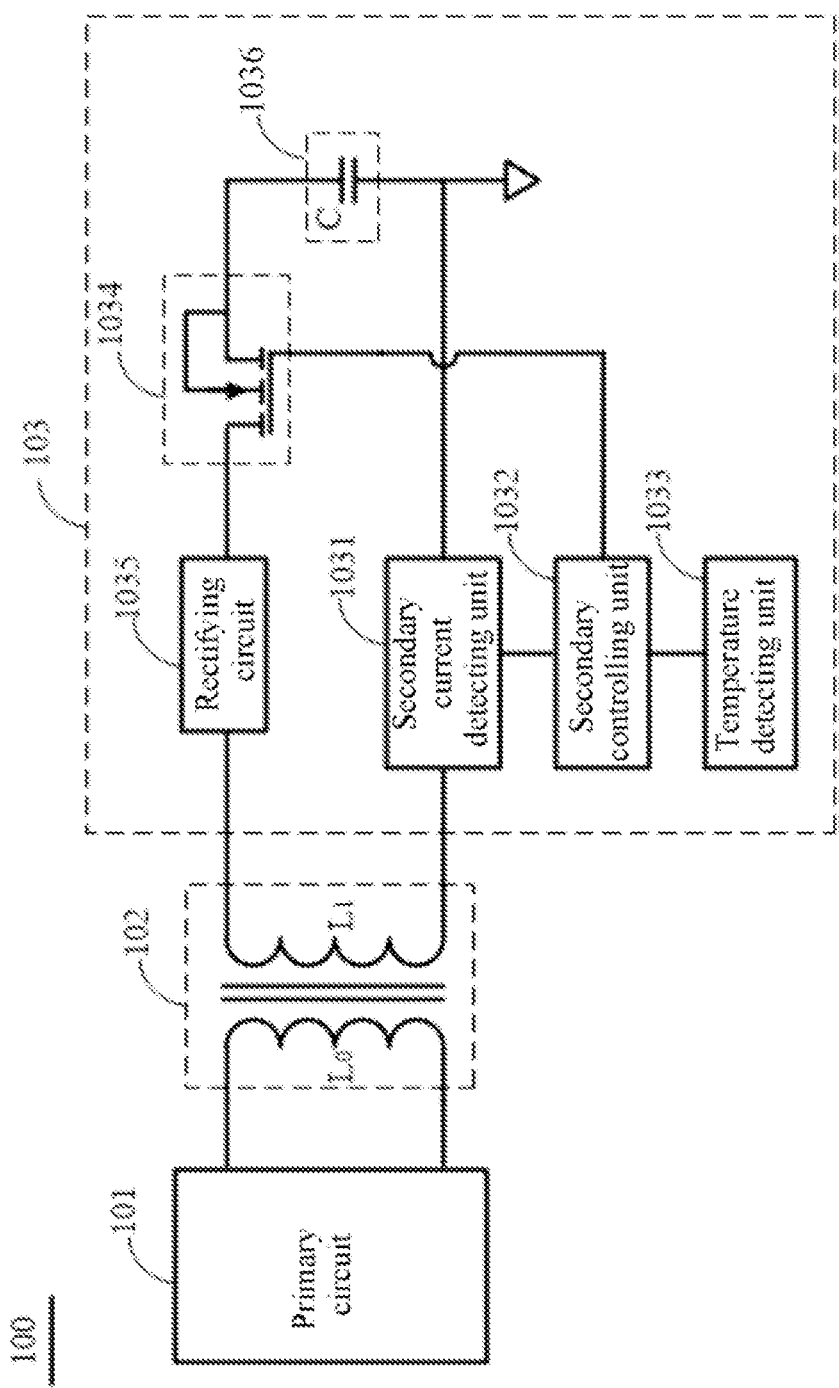
FIG. 1 is a schematic structural diagram of a detecting apparatus provided by an embodiment of the present application.

Herein, exemplary embodiments will be described in detail, examples of which are shown in the drawings. When the following description refers to the drawings, unless otherwise indicated, the same numbers in different drawings represent the same or similar elements. The embodiments described in the following exemplary embodiments do not represent all the embodiments consistent with the present application. On the contrary, they are only examples of methods and apparatuses consistent with some aspects of the present application as detailed in the appended claims.

The terms "first", "second", "third", "fourth", etc. (if any) in the specification and claims of the present application and the above drawings are used to distinguish similar objects, and are not necessarily used to describe a specific order or sequence. It should be understood that the data used in this way can be interchanged under appropriate circumstances, so that the embodiments of the present application described herein can be implemented, for example, in an order other than those illustrated or described herein. Furthermore, the terms "including" and "having" and any variations thereof are intended to cover non-exclusive inclusion, for example, a process, a method, a system, a product or an apparatus including a series of steps or units need not be limited to those steps or units clearly listed, but may include other steps or units that are not clearly listed or are inherent to these processes, methods, products, or devices.

FIG. 1 is a schematic structural diagram of a detecting apparatus provided by an embodiment of the present application, wherein the detecting apparatus is applied to detect an operating state of a power supply 100. As shown in FIG. 1, the power supply 100 includes: a primary circuit 101, a transformer 102 (including a primary winding $L_0$ and a secondary winding $L_1$) and a secondary circuit 103, where the secondary circuit 103 as a detecting apparatus includes:

a secondary current detecting unit 1031, electrically coupled to any one end of the secondary winding of the transformer 102, configured to detect a current value of the secondary circuit 103;

a temperature detecting unit 1033, configured to detect a temperature value of the power supply 100; and a secondary controlling unit 1032, electrically connected to the secondary current detecting unit 1031 and the temperature detecting unit 1033.

Furthermore, the secondary controlling unit 1032 is configured to compare the current value of the secondary circuit 103 with a preset current threshold and determine the operating state of the power supply 100 according to the temperature value of the power supply 100 detected by the temperature detecting unit 1033 when the current value of the secondary circuit 103 is less than or equal to the preset current threshold, so as to realize the detection of the operating state of the power supply 100.

In a possible design, the secondary controlling unit 1032 determines the operating state of the power supply 100 according to the temperature value of the power supply 100, where the secondary controlling unit 1032 is configured to perform the following steps:

acquiring a first temperature value (T1) of the power supply 100 at a first time (t1);

acquiring a second temperature value (T2) of the power supply 100 at a second time (t2);

determining a temperature change rate of the power supply 100 according to the first time (t1), the second time (t2), the first temperature value (T1) and the second temperature value (T2), and comparing the temperature change rate with a preset change rate, where the preset change rate represents a temperature rising rate;

determining that the operating state of the power supply 100 is an abnormal state when the temperature change rate is greater than the preset change rate;

determining that the operating state of the power supply 100 is a normal state when the temperature change rate is less than or equal to the preset change rate.

It can be understood that the secondary current detecting unit 1031 can be an ammeter, the temperature detecting unit 1033 can be a thermometer, and the specifications and models of the ammeter and thermometer can be set according to actual operating conditions, which is not limited in the present embodiment.

Optionally, the secondary controlling unit 1032 can include an integrated circuit (IC) chip and the corresponding control operations that are configured are integrated into the IC chip to be realized.

Optionally, refer to FIG. 1, the secondary circuit 103 of the power supply 100 can further include:

a first power switch 1034.

A first end and a second end of the first power switch 1034 are electrically coupled to a first end and a second end of the secondary winding $L_1$, respectively, and a third end of the first power switch 1034 is electrically coupled to the secondary controlling unit 1032. After determining that the operating state of the power supply 100 is an abnormal state, a control signal output by the secondary controlling unit 1032 controls the first power switch 1034 to turn off to trigger a protection action of the power supply 100.

Optionally, continuing to refer to FIG. 1, the secondary circuit 103 can further include: a rectifying circuit 1035 and an output capacitor (C) 1036.

In the secondary circuit 103, a first end of the rectifying circuit 1035 is electrically coupled to a first end of the secondary winding $L_1$ of the transformer 102, a second end of the rectifying circuit 1035 is electrically coupled to a first end of the output capacitor 1036, and a second end of the output capacitor 1036 is electrically coupled to a second end of the secondary winding $L_1$ of the transformer 102. Specifically, as show in FIG. 1, the first end of the secondary winding $L_1$ is connected to the first end of the rectifying circuit 1035, the second end of the rectifying circuit 1035 is connected to the first end of the first power switch 1034, the second end of the first power switch 1034 is connected to the first end of the output capacitor 1036, and the second end of the output capacitor 1036 is grounded. The third end of the first power switch 1034 is connected to a first end of the secondary controlling unit 1032, a second end and a third end of the secondary controlling unit 1032 are connected to the secondary current detecting unit 1031 and the temperature detecting unit 1033 respectively, and the secondary current detecting unit 1031 is electrically connected between the second end of the secondary winding $L_1$ and the second end of the output capacitor 1036.

It can be understood that locations of the rectifying circuit 1035 and the secondary current detecting unit 1033 in the secondary circuit 103 are not limited to this, as long as the locations can make the rectifying circuit 1035 and the secondary current detecting unit 1033 respectively implement the functions of limiting reverse current and collecting a current value of the secondary circuit 103. The rectifying circuit 1035 can be a diode and other related devices with rectifying function. The rectifying circuit 1035 can also be a circuit with rectifying function. The output capacitor 1036 is used to stabilize an output voltage of the power supply 100. Turning on and turning off of the first power switch 1034 can control correspondingly output of the power supply 100. The secondary current detecting unit 1031 in the secondary circuit 103 can detect the current value of the secondary circuit 103, the temperature detecting unit 1033 of the secondary circuit 103 can detect the temperature value of the power supply 100, and the secondary controlling unit 1032 can determine the temperature change rate of the power supply 100 according to the acquired current value of the secondary circuit 103 and the temperature value of the power supply 100 when the current value of the secondary circuit 103 is less than or equal to the preset current threshold, thus realizing the detection of the operating state of the power supply 100. Further, the temperature detecting unit 1033 mainly detects temperature values of the transformer 102 and the rectifying circuit 1035 in the power supply 100.

Figure 2:
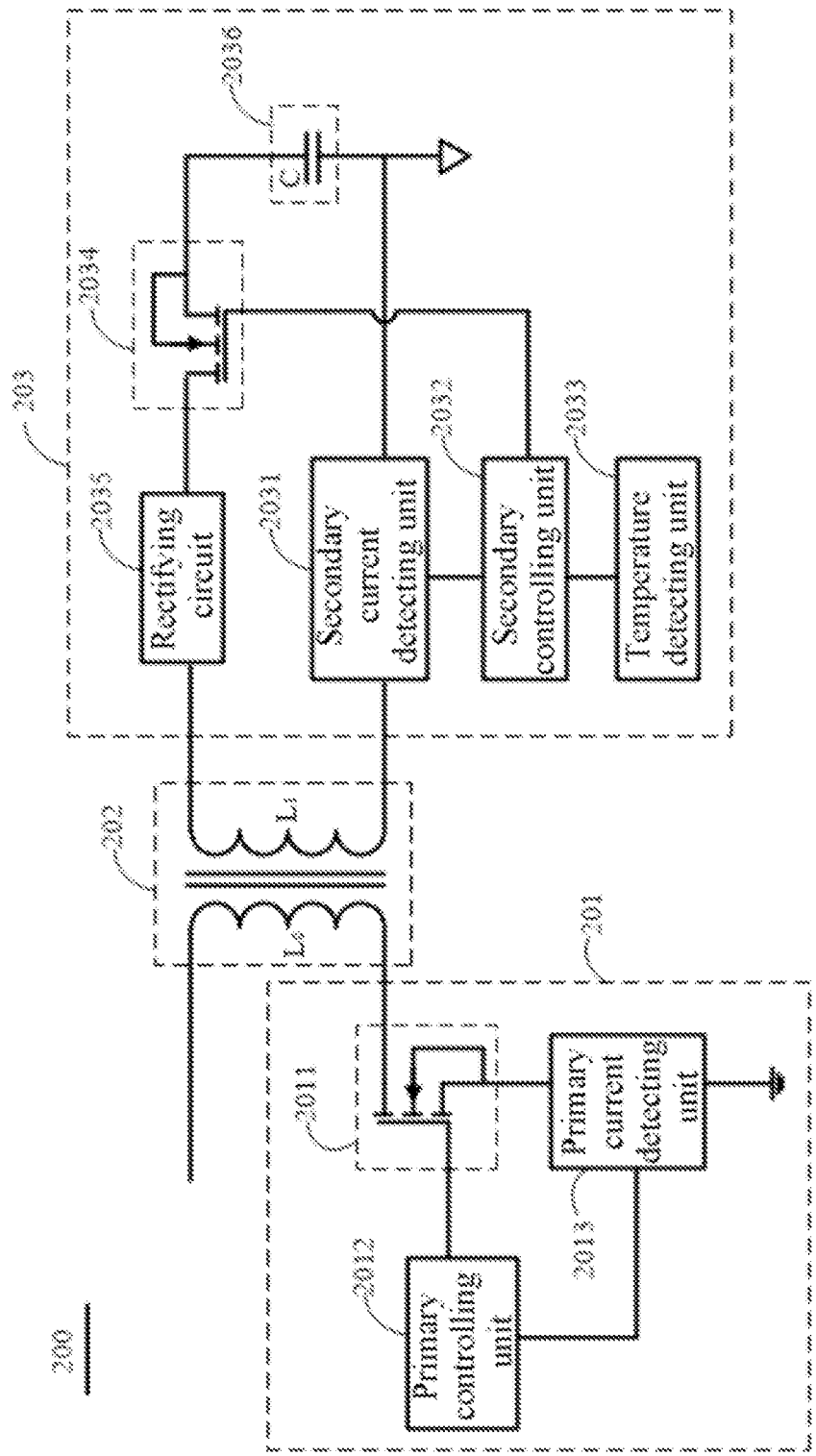
FIG. 2 is another schematic structural diagram of a detecting apparatus provided by an embodiment of the present application.

FIG. 2 is another schematic structural diagram of a detecting apparatus provided by an embodiment of the present application. The detecting apparatus is applied to detect an operating state of a power supply 200. As show in FIG. 2, the power supply 200 includes: a primary circuit 201, a transformer 202 (including a primary winding $L_0$ and a secondary winding $L_1$) and a secondary circuit 203. And the secondary circuit 203 includes: a secondary current detecting unit 2031, a secondary controlling unit 2032 and a temperature detecting unit 2033. Optionally, the secondary circuit 203 further includes: a first power switch 2034, a rectifying circuit 2035 and an output capacitor 2036. The above components are similar to components shown in FIG. 1, and reference numerals of similar components represent the structures, effects and functions of the similar components, so it is not repeated herein.

In the present embodiment, the primary circuit 201 of the power supply 200 includes: a second power switch 2011, a primary controlling unit 2012 and a primary current detecting unit 2013. In the primary circuit 201, one end of the primary winding is connected to a first end of the second power switch 2011, and the other end of the primary winding is connected to a input end of the power supply, a second end of the second power switch 2011 is connected to a first end of the primary controlling unit 2012, a third end of the second power switch 2011 is connected to a first end of the primary current detecting unit 2013, and a second end of the primary current detecting unit 2013 is connected to a second end of the primary controlling unit 2012. The primary controlling unit 2012 correspondingly controls an output of the power supply 200 by turning the second power switch 2011 on or off. A third end of the primary current detecting unit 2013 is grounded.

In addition, the primary current detecting unit 2013 can detect a current value of the primary circuit 201, and the primary controlling unit 2012 can include an IC chip to perform corresponding control operations through the IC chip, e.g., the primary controlling unit 2012 can detect an output power of the power supply 200 and determine the operating state of the power supply 200 according to a voltage value of the primary circuit 201 collected by the primary controlling unit 2012 and the current value of the primary circuit 201 detected by the primary current detecting unit 2013. However, since current detection accuracy and voltage detection accuracy of the primary controlling unit 2012 are low, actual output power of power supply 200 cannot be accurately calculated.

Optionally, the power supply 100 and the power supply 200 provided by the present application can also be a power adapter.

The secondary circuit 103 (or 203) of the power supply 100 (or 200) provided in the present application can be used as a detecting apparatus to detect the operating state of the power supply 100 (or 200), and when rated output power of the power supply 100 (or 200) is greater than 0 and less than or equal to 100 W, the detecting apparatus can further enable the power supply 100 (or 200) to meet requirements of limited power supply (LPS) test specification, that is, when the secondary current detecting unit 1031 (or 2031) detects that a current value of the secondary circuit 103 (or 203) is less than or equal to a preset current threshold, the operating state of power supply 100 (or 200) can be determined according to a temperature value of the power supply 100 (or 200) detected by temperature detecting unit 1033 (or 2033) and the protection action of the power supply 100 (or 200) is triggered when the operating state of the power supply 100 (or 200) is the abnormal state. The preset current threshold is any value slightly greater than 0 (for example, 0.1 A), and the preset current threshold can be dynamically adjusted according to actual operating conditions to represent that the secondary current detecting unit 1031 (or 2031) is in an abnormal state (for example, is bypassed).

It should be noted that the above application scenarios are only schematic, and the detecting apparatus applied to detect the operating state of the power supply provided by embodiments of the present application includes but not limited to the above application scenarios.

The above is a detailed description of an operating principle and an implementation process of the detecting apparatus provided by the embodiments of the present application. A detailed technical solution of a detecting method of the operating state of the power supply provided by the embodiments of the present application will be described below. The following several specific embodiments can be combined with each other, and the same or similar concepts or processes may not be repeated in some embodiments. The embodiments of the present application will be described with reference to attached drawings.

Figure 3:
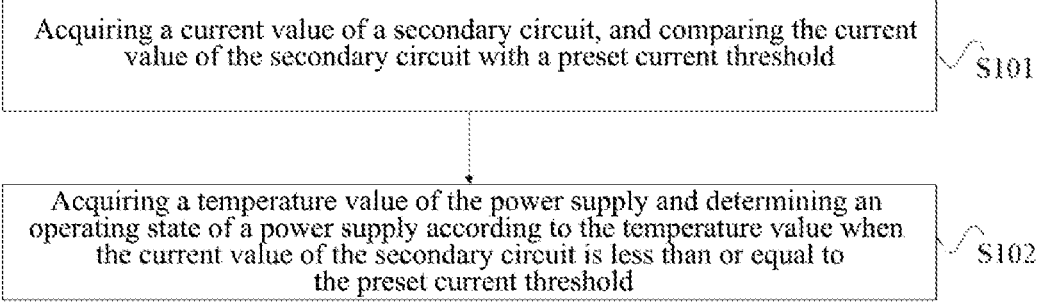
FIG. 3 is a flow diagram of a detecting method of an operating state of a power supply provided by an embodiment of the present application.

FIG. 3 is a flow diagram of a detecting method of an operating state of a power supply provided by an embodiment of the present application, where the power supply includes a secondary circuit. Further, the detecting method of the operating state of the power supply can be implemented in any of the above-mentioned power supply. As show in FIG. 3, the detecting method of the operating state of the power supply provided by the present embodiment includes:

S101: acquiring a current value of the secondary circuit, and comparing the current value of the secondary circuit with a preset current threshold.

For example, a secondary current detecting unit in the secondary circuit is used to detect a current of the secondary circuit, and then the obtained current value of the secondary circuit is compared with the preset current threshold. And the preset current threshold can be dynamically adjusted.

S102: acquiring a temperature value of the power supply and determining the operating state of the power supply according to the temperature value when the current value of the secondary circuit is less than or equal to the preset current threshold.

The acquired current value of the secondary circuit is compared with the preset current threshold, and when the current value of the secondary circuit is less than or equal to the preset current threshold, the temperature value of the power supply is further acquired and the operating state of the power supply is determined according to the acquired temperature value, where the temperature detecting unit in the secondary circuit can be used to detect the temperature value of the power supply, and the secondary controlling unit determines the operating state of the power supply according to the temperature value.

In a possible design, the temperature value of the power supply is acquired and the operating state of the power supply is determined according to the temperature value when the current value of the secondary circuit is equal to 0.

In a possible design, due to limitation of sampling accuracy of the secondary current detecting unit and influence of various interferences in sampling, the preset current threshold can be dynamically adjusted to any value slightly greater than 0. If an actual current value of the secondary circuit is less than or equal to the preset current threshold, the current value of the secondary circuit can be approximately determined to be 0.

Further, when the current value of the secondary circuit is equal to 0, the normal state of the power supply should be in no-load state, and corresponding components such as a transformer in the power supply may not generate heat, or the transformer generates heat but the generated heat will gradually decrease. However, when the secondary current detecting unit of the power supply is in abnormal state (for example, is bypassed), the secondary current detecting unit cannot correctly detect an output current of the power supply. At this time, the output current of the power supply is also equal to 0 or approximately equal to 0, but with the increase of an output power of the power supply, corresponding components such as the transformer in the power supply will generate more and more heat. Therefore, when the current value of the secondary circuit is less than or equal to the preset current threshold, the operating state of the power supply can be determined by detecting the temperature value of the power supply.

Figure 4:
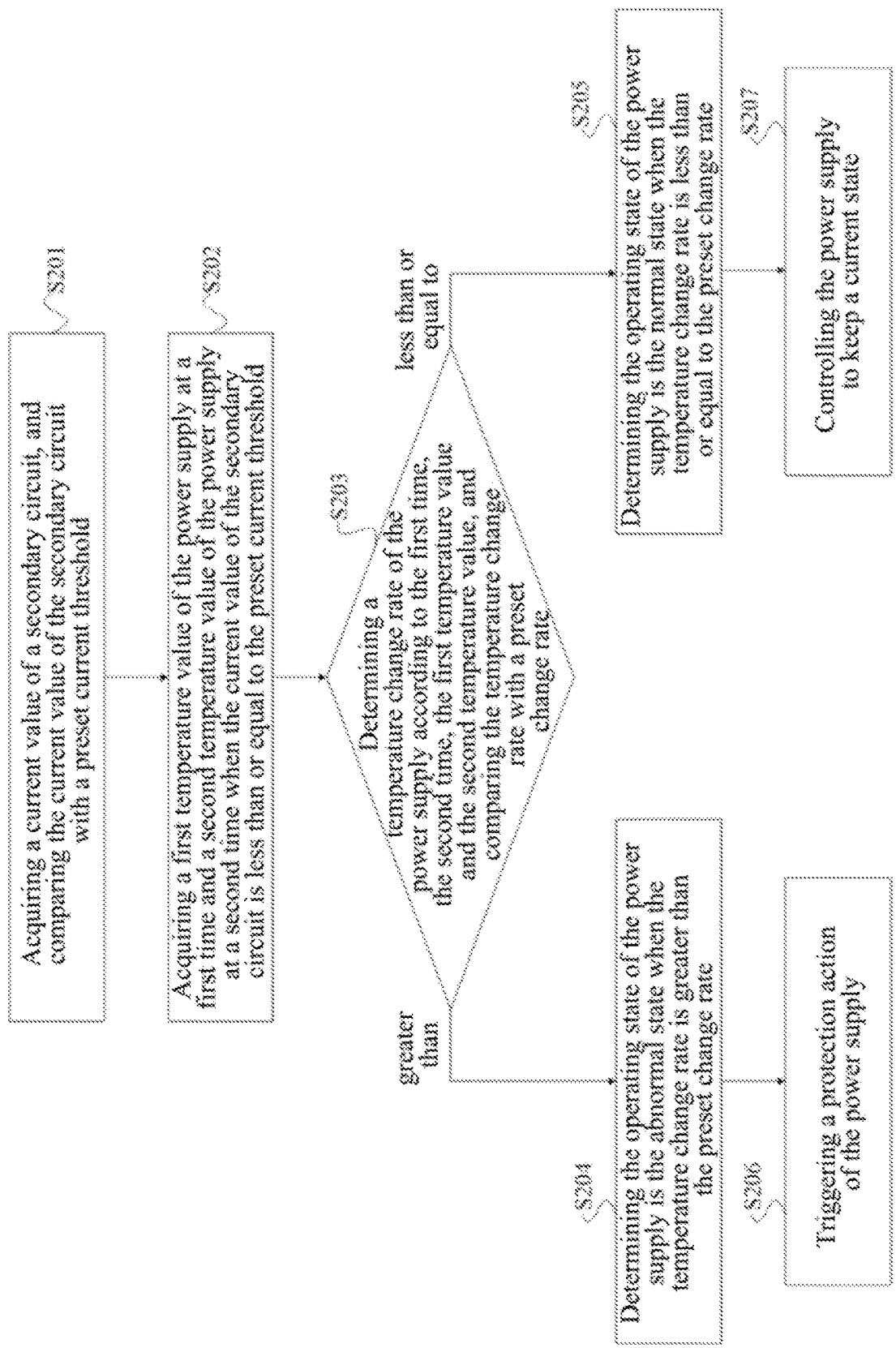
FIG. 4 is a flow diagram of another detecting method of an operating state of a power supply provided by an embodiment of the present application.

FIG. 4 is a flow diagram of another detecting method of an operating state of a power supply provided by an embodiment of the present application, where the power supply includes a secondary circuit. Further, the detecting method of the operating state of the power supply can be implemented in any one of the above-mentioned power supply, the detecting method of the operating state of the power supply provided by the present embodiment includes:

S201: acquiring a current value of the secondary circuit, and comparing the current value of the secondary circuit with a preset current threshold.

For example, a secondary current detecting unit in the secondary circuit is used to detect a current of the secondary circuit, and then the obtained current value of the secondary circuit is compared with the preset current threshold. And the preset current threshold can be dynamically adjusted.

S202: acquiring a first temperature value of the power supply at a first time and a second temperature value of the power supply at a second time when the current value of the secondary circuit is less than or equal to the preset current threshold.

The first time and the second time are any two times separated by a preset time, and the value of the preset time can be in seconds, and the specific value is not limited in the present embodiment.

A temperature value of the power supply is acquired at the first time ($t_1$), and the acquired temperature value is the first temperature value ($T_1$). Further, a temperature value of the power supply is acquired at the second time ($t_2$), and the acquired temperature value is the second temperature value ($T_2$).

For example, the temperature detecting unit in the secondary circuit detects respectively the temperature value of the power supply at the first time and the second time to acquire the first temperature value and the second temperature value.

S203: determining a temperature change rate of the power supply according to the first time, the second time, the first temperature value and the second temperature value, and comparing the temperature change rate with a preset change rate.

Where the preset change rate represents a temperature rising rate.

After obtaining the first temperature value at the first time and the second temperature value at the second time, temperature change situation of the power supply in a time period between the first time and the second time can be determined accordingly.

In a realizable way, when the second time is later than the first time, the temperature change situation of the power supply can be determined by the following expression (1):

$$a_1 = \frac{T_2 - T_1}{t_2 - t_1} \quad (1)$$

Correspondingly, when the first time is later than the second time, the temperature change situation of the power supply can be determined by the following expression (2):

$$a_2 = \frac{T_1 - T_2}{t_1 - t_2} \quad (2)$$

Where $a_1$ and $a_2$ in the above expressions (1) and (2) respectively represent a temperature change rate of the power supply in a time interval between $t_1$ and $t_2$.

After obtaining the temperature change rate of the power supply, the temperature change rate is compared with the preset change rate to determine the operating state of the power supply according to a comparison result.

A specific value of the preset change rate can be set according to actual operating condition, for example, the preset change rate can be described as that the temperature of the power supply rises by 3° C. in 40s. Obviously, it can also be described as that the temperature of the power supply rises by 4° C. or other temperature values in 40s, and the temperature of the power supply rises by other corresponding temperatures in other time periods, etc., which is not limited in the present embodiment.

After comparing the temperature change rate of the power supply with the preset change rate, it can be determined that the operating state of the power supply is normal state or abnormal state according to the comparison result, that is, step S204 or step S205 is executed according to the comparison result. In addition, it should be noted that when the secondary current detecting unit of the power supply is bypassed, the no-load state is the normal operating state of the power supply.

S204: determining the operating state of the power supply is the abnormal state when the temperature change rate is greater than the preset change rate.

It can be seen from the above description that when the temperature change rate is greater than the preset change rate, it indicates that the temperature of the power supply rises rapidly, which has exceeded a temperature rising rate corresponding to the preset change rate, thus determining the operating state of the power supply is the abnormal state.

S205: determining the operating state of the power supply is the normal state when the temperature change rate is less than or equal to the preset change rate.

On the contrary, when the obtained temperature change rate of the power supply is less than or equal to the preset change rate, the following situations may be exist:

In a first situation, the temperature value of the power supply does not change during an interval between the first time and the second time, that is, the determined temperature change rate of the power supply is zero, the temperature change rate is less than the preset change rate;

In a second situation, the temperature value of the power supply drops during the interval between the first time and the second time, that is, the determined temperature change rate of the power supply is a negative value, and the temperature change rate is less than the preset change rate;

In a third situation, the temperature value of the power supply rises during the interval between the first time and the second time, but the rising rate (the determined temperature change rate of the power supply) is less than or equal to the preset change rate, that is, the rising rate of the power supply temperature during the interval between the first time and the second time is slow and does not exceed the preset change rate.

When the determined temperature change rate of the power supply belongs to any one of the above situations, the operating state of the power supply can be determined as the normal state. In other words, when the secondary current detecting unit of the power supply is in the abnormal state, if the temperature change rate of the power supply is less than or equal to the preset change rate, it can be determined that the operating state of the power supply is the normal state.

After determining the operating state of the power supply, step S206 or step S207 can be further executed according to the determined operating state.

Step S206 is executed when the operating state of the power supply is determined as the abnormal state. Step S207 is executed when the operating state of the power supply is determined as the normal state.

S206: triggering a protection action of the power supply.

The protection action includes at least one of turning off the output of the power supply, restarting the power supply, and reducing an output voltage of the power supply.

When determining that the operating state of the power supply is abnormal state, it is necessary to trigger the protection action of the power supply, where the protection action includes but is not limited to at least one of turning off the output of the power supply, restarting the power supply, reducing the output voltage of the power supply, etc. It can also be specifically set according to the actual situation, which is not limited in the present embodiment.

S207: controlling the power supply to keep a current state.

When determining that the operating state of the power supply is normal state, controlling the power supply to keep the current state. For example, controlling the power supply to keep the current output state, etc.

According to the detecting method of the operating state of the power supply provided by the embodiment of the present application, when the secondary current detecting unit of the power supply is in the abnormal state, the temperature value of power supply can be obtained to determine whether the power supply is in the normal state or in the abnormal state according to the temperature change rate of the power supply, thereby realizing detection of the operating state of the power supply. Only the secondary circuit of the power supply can independently detect the operating state of the power supply, and detection method is simple and easy to operate. In addition, the dependence on the power detection accuracy of the primary circuit of the power supply can also be reduced, and the power supply cost cannot be increased, so it has a higher realizability and a wider applicability.

With the rapid development of science and technology, in some requirements for power levels, the limited power supply (LPS) test specification is a common specification that a small power supply needs to meet. For the LPS specification, it required that when the secondary current detecting unit of the power supply is bypassed, if the output power of the power supply exceeds a limited output power, the corresponding protection action needs to be triggered. Therefore, the above-mentioned detecting method of the operating state of the power supply can be applied to the LPS test specification of the power supply, in other words, the detecting method of the operating state of the power supply provided by the present application can be used to make the power supply meet the LPS test specification. For example, when the obtained current value of the secondary circuit is equal to 0 or approximately equal to 0, that is, the obtained current value of the secondary circuit is less than or equal to a preset current threshold, it is indicated that the power supply has no output current or the secondary current detecting unit is in an abnormal state (for example, is bypassed). And if it is further determined that the operating state of the power supply is abnormal state, the protection action of the power supply can be triggered.

Specifically, the detecting method of the operating state of the power supply provided by the present embodiment of the present application can apply to the power supply as shown in FIG. 1 or FIG. 2. When rated output power of the power supply approaches a limited power of the power supply, because the power detection accuracy of the primary controlling unit is not high enough, when the secondary current detecting unit is bypassed, only relying on the primary controlling unit will make the power supply fail to meet the LPS test specification. Therefore, the detecting method of the operating state of the power supply provided by the present embodiment can make the power supply meet LPS test specification when the power detection accuracy of the primary controlling unit is insufficient.

The specific requirements of the LPS test specification have been corresponding stipulated in the 60950IEC□1 standard, which will not be repeated herein. Usually, for the power supply with the rated output power being greater than 0 and less than or equal to 100 W, its operating state is required to meet the LPS test specification. Therefore, the rated output power of the power supply applicable to the detecting method of the operating state of the power supply provided by the embodiment of the present application can be greater than 0 and less than or equal to 100 W.

The present application provides a detecting method of an operating state of a power supply and a detecting apparatus. The power supply includes a primary circuit, a transformer and a secondary circuit. The secondary circuit as the detecting apparatus includes a secondary current detecting unit, a temperature detecting unit and a secondary controlling unit. Firstly the secondary current detecting unit detects a current value of the secondary circuit, and then the secondary controlling unit compares the current value of the secondary circuit with a preset current threshold. When the current value of the secondary circuit is less than or equal to the preset current threshold, the temperature detecting unit detects a temperature value of the power supply and determines the operating state of the power supply according to the acquired temperature value of the power supply, thus independently realizing the detection of the operating state of the power supply by using the secondary circuit of the power supply. The detection method can determine the operating state of the power supply according to the temperature value of the power supply detected by the temperature detecting unit when the secondary current detecting unit is in the abnormal state, so as to reduce dependence on the power detection accuracy of the primary circuit, which not only has a higher realizability and a wider applicability, but also has the advantage of not increasing the power supply cost.

Those skilled in the art will easily think of other implementations of the present application after considering the specification and practicing the present disclosure disclosed herein. The present application is intended to cover any modification, use or adaptation change of the present application, which follows the general principles of the present application and includes the common knowledge or conventional technical means in the present technical field which is not disclosed in the present application. The specification and embodiments are only regarded as examples, and the true scope and spirit of the present application are pointed out by the claims.

It should be understood that the present application is not limited to the precise structure described above and shown in the figures, and various modifications and changes can be made without departing from its scope. The scope of the present application is limited only by the appended claims.

What is claimed is:

1. A detecting method of an operating state of a power supply, wherein the power supply comprises a secondary circuit, the detecting method comprising:
    acquiring a current value of the secondary circuit, and comparing the current value of the secondary circuit with a preset current threshold;
    acquiring a temperature value of the power supply and determining the operating state of the power supply according to the temperature value when the current value of the secondary circuit is less than or equal to the preset current threshold.

2. The detecting method of the operating state of the power supply according to claim 1, wherein the acquiring the temperature value of the power supply and determining the operating state of the power supply according to the temperature value comprises:
    acquiring a first temperature value of the power supply at a first time;
    acquiring a second temperature value of the power supply at a second time; and
    determining a temperature change rate of the power supply according to the first time, the second time, the first temperature value and the second temperature value, and comparing the temperature change rate with a preset change rate, wherein the preset change rate represents a temperature rising rate;
    determining that the operating state of the power supply is an abnormal state when the temperature change rate is greater than the preset change rate;
    determining that the operating state of the power supply is a normal state when the temperature change rate is less than or equal to the preset change rate.

3. The detecting method of the operating state of the power supply according to claim 1, wherein the preset current threshold is 0.1 A.

4. The detecting method of the operating state of the power supply according to claim 1, wherein the power supply comprises a power adapter.

5. A detecting apparatus, which is applied to detect an operating state of a power supply, wherein the power supply comprises a primary circuit, a transformer and a secondary circuit, the secondary circuit as the detecting apparatus comprising:
    a secondary current detecting unit, electrically coupled to any one end of a secondary winding of the transformer, configured to detect a current value of the secondary circuit;
    a temperature detecting unit, configured to detect a temperature value of the power supply; and
    a secondary controlling unit, electrically connected to the secondary current detecting unit and the temperature detecting unit, wherein the secondary controlling unit is configured to compare the current value of the secondary circuit with a preset current threshold, and determine the operating state of the power supply according to the acquired temperature value of the power supply when the current value of the secondary circuit is less than or equal to the preset current threshold.

6. The detecting apparatus according to claim 5, wherein the preset current threshold is 0.1 A.

7. The detecting apparatus according to claim 5, wherein the secondary circuit further comprises: a rectifying circuit and an output capacitor;
    wherein a first end of the rectifying circuit is electrically coupled to a first end of a secondary winding of the transformer, a second end of the rectifying circuit is electrically coupled to a first end of the output capacitor, and a second end of the output capacitor is electrically coupled to a second end of the secondary winding of the transformer.

* * * * *